United States Patent [19]

Glenn

[11] Patent Number: 5,332,686
[45] Date of Patent: Jul. 26, 1994

[54] METHOD OF MANUFACTURING LARGE CAPACITY SOLID-STATE MEMORY

[75] Inventor: William E. Glenn, Fort Lauderdale, Fla.

[73] Assignee: Florida Atlantic University, Boca Raton, Fla.

[21] Appl. No.: 129,454

[22] Filed: Sep. 29, 1993

Related U.S. Application Data

[62] Division of Ser. No. 780,248, Oct. 22, 1991, Pat. No. 5,274,602.

[51] Int. Cl.$^5$ ............................................. H01L 21/72
[52] U.S. Cl. ...................................... 437/52; 437/40; 437/43
[58] Field of Search .................. 437/40, 43, 51, 52, 437/101, 926; 148/DIG. 1, DIG. 21

[56] References Cited

U.S. PATENT DOCUMENTS

| 4,701,860 | 10/1987 | Madar | 437/51 |
| 5,034,340 | 7/1991 | Tanaka et al. | 437/101 |
| 5,252,507 | 10/1993 | Hively et al. | 437/52 |
| 5,254,480 | 10/1993 | Tran | 437/52 |

Primary Examiner—Tom Thomas
Assistant Examiner—Chandra Chaudhari
Attorney, Agent, or Firm—Brumbaugh, Graves, Donohue & Raymond

[57] ABSTRACT

Method for producing a large capacity solid-state memory wherein thin film technology is used to form a plurality of large-area arrays of memory cells, each of which is fabricated in a continuous process on a thin flexible substrate to form an elongate tape. The plurality of tapes are assembled into a compact package by winding them, one upon the other, into a spool which is placed in a suitable housing.

4 Claims, 4 Drawing Sheets

METHOD OF MANUFACTURING LARGE CAPACITY SOLID-STATE MEMORY

This application is a division of application Ser. No. 07/780,248, now U.S. Pat. No. 5,274,602, filed on Oct. 22, 1991.

BACKGROUND OF THE INVENTION

This invention generally relates to semiconductor memories and, more particularly to a digitally addressable memory device capable of storing on the order of terabytes of information and method for manufacturing the memory.

There are many applications, including imaging, for very large solid-state memories having storage capacities of the order of $10^{10}$ to $10^{13}$ bits. For example, the development of high-definition television (HDTV) in countries around the world has required the development of systems for shooting, recording, broadcasting, editing, receiving and displaying these high quality pictures. Currently, the storage of the quantities of information of the magnitude needed to store HDTV programs of reasonable length is done with either magnetic or optical storage devices, both of which are bulky, cannot easily be addressed randomly and have a slow fixed readout speed. Thus, there is a need for a digitally addressable memory having a capacity capable of recording say, two hours of HDTV, in color, that can be loaded or clocked out at gigabit rates. Memories of this size cannot be fabricated using standard silicon wafer processing techniques, even with the developing 200 mm crystalline-silicon wafer technology; therefore, it appears unlikely that economic DRAM memories of this size and speed will result from traditional manufacturing techniques within the next decade.

Accordingly, it is an object of the present invention to provide a compact solid-state memory device having a storage capacity of the order of one terabyte, that can be clocked at high speed.

Another object of the invention is to provide a large capacity solid-state memory device that can be fabricated in a continuous process using thin film transistor technology.

Another object of the invention is to provide a method for fabricating such a memory device.

SUMMARY OF THE INVENTION

The present invention is directed to a solid-state memory device having extremely large storage capacity, on the order of terabytes, that can be clocked at gigabit rates, and therefore particularly suited for recording HDTV programming for example. Information is stored in a crossed-wire matrix of memory cells fabricated on thin flexible tape in a continuous process, using thin film transistor technology. If submicron lithography is used, a memory having a capacity of one terabyte comprises ten tapes about 10 cm (4 inches) wide and about 200 meters (650 feet) long, each having approximately one hundred-parallel tracks of memory cells which, in one embodiment, is a floating gate one-bit memory. Each tape has a silicon chip bonded to or otherwise connected to one end of the elongated matrix which contains a shift register for controlling a set of transistor switches for reading out the one hundred tracks sequentially. Addressing circuits for the cross-wire matrix, one per frame, are provided at selected locations on each tape. For read-out, a frame number is simply addressed sequentially, and since frame numbers can be started at any point in the sequence, the recording can play from any point instantly, at any speed, forward or reverse. The architecture design of the memory depends on parallel processing of large amounts of information accessed by a "tree" of addressing circuitry with multiple branches, which provides a geometric progression to massive capacity from sources that have very high clock speeds. This structure minimizes the interconnect problems of simple sequential-to-parallel switching architecture, and also provides non-coherence between drop-outs so that error-correcting codes can be used to provide memories with high yield in the presence of a reasonable level of manufacturing defects.

The ten tapes are assembled into a compact package by bonding the read-out end of each tape to a cylindrical hub having a length corresponding to the tape width, with the respective ends distributed around the circumference of the hub to provide independent access to each read-out chip, and rolling the tapes one upon the other to form a spool of interleaved tapes. The spool is placed in a suitable housing which for a memory of the described density is about 5 in.$\times$5 in.$\times$4 in. for a terabit of memory. Eight of the units can store a terabyte, or alternatively, a terabyte of image data can be stored in one unit in compressed form, if a compression ratio of 8:1 is used.

The memory cells, addressing circuits and necessary switching devices of the memory are formed on a flexible substrate using lithographic techniques and processes similar to those currently used for manufacturing LCD panels. Generally, the process includes the sequential steps of laying down a layer, laying down a resist, drying, exposing, developing, etching, laying down another resist, and so on until all of the required circuits are formed. In order to manufacture the tape at acceptable cost, all of the steps are performed on a reel-to-reel continuous process. Some steps are performed in air, some in another gas, some in a vacuum, etc.; the number of steps that can be performed per reel-to--reel pass depends on the speed needed for each step and the environment.

Other objects, features and advantages of the invention will become apparent, and its construction and operation better understood, from the following detailed description, when read in conjunction with the accompanying drawings.

DESCRIPTION OF THE PREFERRED EMBODIMENTS

Figure 1:
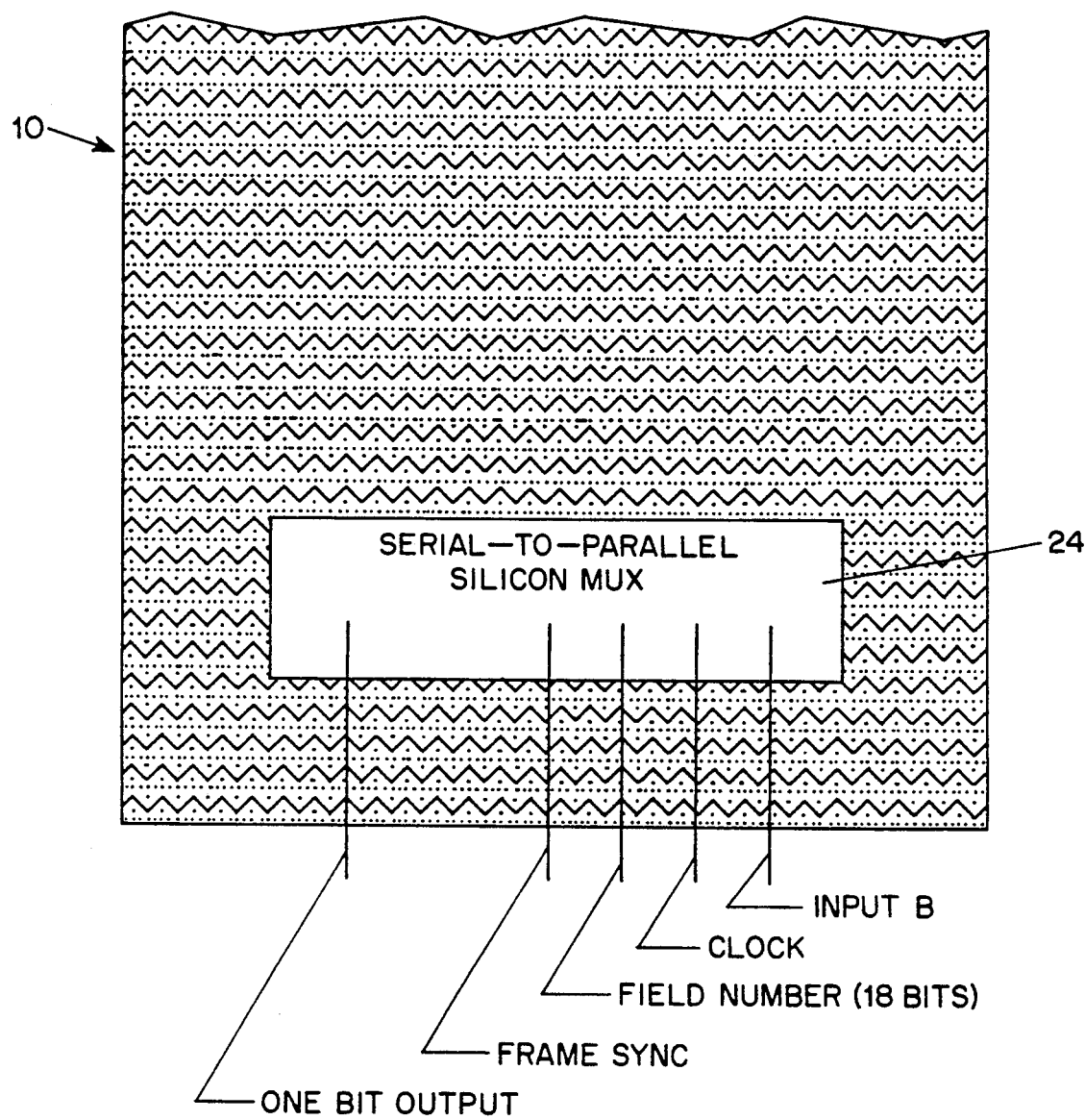
FIG. 1 is a diagrammatic plan view, greatly enlarged, of a fragmentary portion of a tape showing the pattern of tracks thereon.

The information storage device of the invention takes advantage of the well-known principle that continuous manufacturing processes can produce large areas of manufactured material at a dramatically lower cost than batch processes, and the very recent development of a viable continuous process for inexpensively producing photovoltaic cells on thin flexible, plastic substrates. This recent technical development coupled with known thin film semiconductor technology makes it possible to manufacture high capacity memories at reasonable cost. The required large-area memory array is fabricated on an insulating flexible substrate which is transported by a continuous reel-to-reel photolithography and etching process.

Deferring until later a description of details of the manufacturing process, the large-area memory according to the invention is in the form of an elongate flexible tape 10, a fragmentary portion of the length of which is diagrammatically illustrated in FIG. 1. Typically, the completed tape may be four inches (10 cm.) wide, two hundred meters (650 feet) long and thirty microns thick and consists of an array of a large number of memory cells deposited on a flexible substrate. By way of example, the width of the tape is divided into one hundred parallel tracks, each one millimeter wide, and as indicated in FIG. 2, which is a greatly enlarged view of one of the 1 mm-wide tracks shown in FIG. 1, each of these tracks, in turn, is divided into two hundred columns, each five $\mu$m wide. Although each track is divided into two hundred columns as stated, and the drawing so indicates, for clarity only one-tenth of that number, or twenty, are depicted. The two hundred columns of each track form an active cross-wired matrix with a multiplicity of similarly spaced rows, and a memory cell 12 is provided at each crossing of the matrix to form one frame of memory.

Every 500 $\mu$m (one hundred rows at 5 $\mu$m per row) along the length of the tape 10 an addressing circuit 14 is provided for accessing the matrix. Again, although FIG. 2 depicts the matrix as having one hundred rows, for clarity only fifteen are shown. The addressing circuit, one of which is located at the beginning of each frame, is conventional and consists of vertical and horizontal scan decoders 16 and 18 respectively connected to the rows and columns of the matrix, an address comparator 20 which under control of a horizontal clock reads the information carried by an 18-bit sequential address input and delivers the information to the horizontal scan decoder 18, which also receives a horizontal reset pulse. Under control of a line index clock and frame index reset pulses applied to vertical scan decoder 16 and the information applied to the horizontal scan decoder 18, the circuit produces via an output driver 22, a digital output representative of the information stored in the matrix.

The required addressing circuits for the multiplicity of frame arrays is formed on the tape substrate using thin film semiconductor technology, as are the eighteen address input, clock input, and digital output lines, all of which extend for the entire length of the tape. Addressing information is applied to and digital output information is derived from all of the matrices carried on the tape via a serial-to-parallel multiplexer chip 24 connected to said lines at one end of the tape 10, as schematically depicted in FIG. 1. The chip 24, which contains a shift register for controlling a set of transistor switches arranged to read out the one hundred tracks sequentially, may be bonded to the tape and its elements electrically connected to the appropriate lines in much the same way that silicon control circuits currently are bonded to the edge of the active-matrix array of an LCD panel fabricated with thin film transistor technology. An example of this construction is described in an article entitled "A 1.5-Megapixel a-Si TFT-LCD Module for HDTV Projector" by Y. Okita et al. published in SID 91 Digest, pp. 411–414. With the described geometry, each of the one hundred tracks has an output with a 1 MHz clock rate, which is a multiple of and therefore within the capability of TFT technology.

An important feature of the present memory device is that a multiplicity of the described tapes are operated in parallel and addressed sequentially, thereby to achieve an effective clock rate which is much higher than the 1 MHz clock rate of an individual track. In a memory system which utilizes 8-bit encoding, ten of the described tapes, each having a serial-to-parallel multiplexer 24 connected at one end, are operated in parallel; the one-bit output of each multiplexer is one of the ten bits conventionally used for gray scale rendition, that is, 8-bit encoding with two bits for subsequent error correction. It will be apparent that the described memory architecture processes in parallel the large amounts of information capable of being stored in the large-area matrices by accessing with a "tree" of addressing circuitry having multiple branches, one of which is shown in FIG. 2, so as to provide a geometric progression to massive capacity from sources that have high clock speeds. The structure has less severe interconnect problems than simple sequential-to-parallel switching architectures, and because different bits in the code are put on different tracks, so as not to be near each other, thereby to minimize the possibility that errors are correlated and make it possible for error-correcting codes to take care of "drop-outs" and provide memories with high yield even in the presence of a reasonable level of manufacturing defects.

Figure 3:
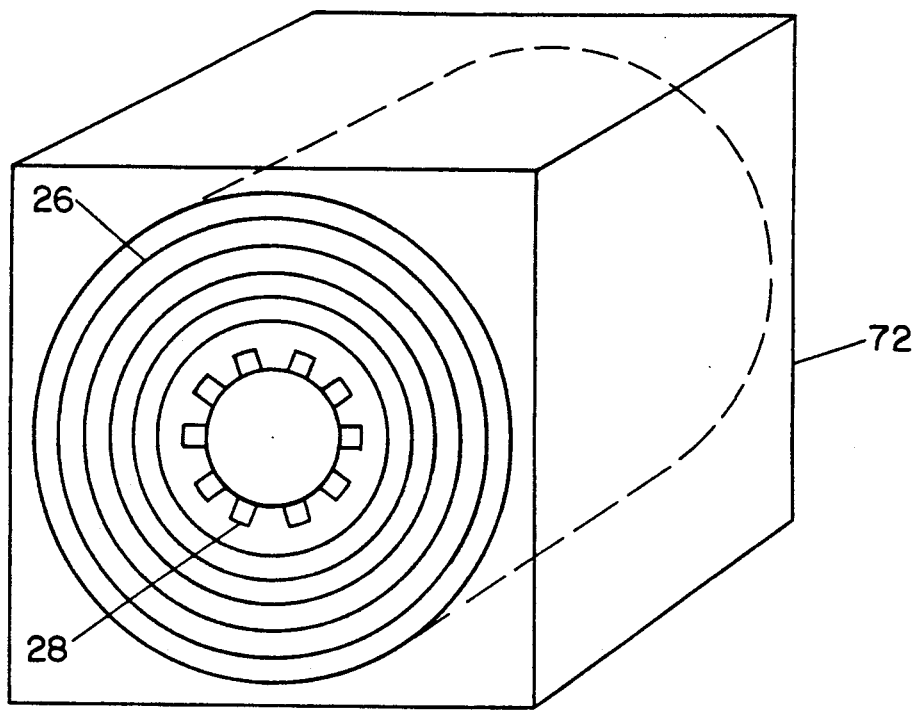
FIG. 3 is a pictorial view of an assembled memory device constructed in accordance with the invention.

As shown in FIG. 3, the ten tapes required for a memory device having a capacity of one terabit are assembled into a compact package by rolling them together, in interleaved fashion, to form a spool 26. Preparatory to assembly, the ten tapes are rolled up and supported on respective spindles, and the end of each to which the serial-to-parallel multiplexing interface is bonded is secured to a cylindrical hub 28, which is about four inches long and about one inch in diameter, with their respective multiplexer chips 24 uniformly distributed around the circumference of the hub to provide separate access to each. Then, the hub is rotated in a direction to draw the ten tapes from their respective rolls and to roll them up, one on top of the other to form the spool 26 of interleaved tapes, which has a diameter of about five inches. The spool 26 is supported in a suitable housing 29, diagrammatically shown as a 5 in.$\times$5 in.$\times$4 in. box-like container.

Eight of the units shown in FIG. 3 will store one terabyte of uncompressed data; if information representing images is to be stored, by using relatively conventional data compression/signal processing algorithms the memory storage capability can be increased by over a factor of eight, thus allowing one terabyte of image information to be stored in a single unit. Eight of the units shown in FIG. 3 will store two hours of uncompressed digital HDTV in the 1035×1920 pixel studio production format, and for consumer HDTV in compressed format, two hours would require less than one terabit, i.e., only one of the units depicted in FIG. 3. Other applications for this high density memory include storage of downloaded digital video for delayed replay in cable systems, electronic cinemas and large memories in personal computers.

Figure 2:
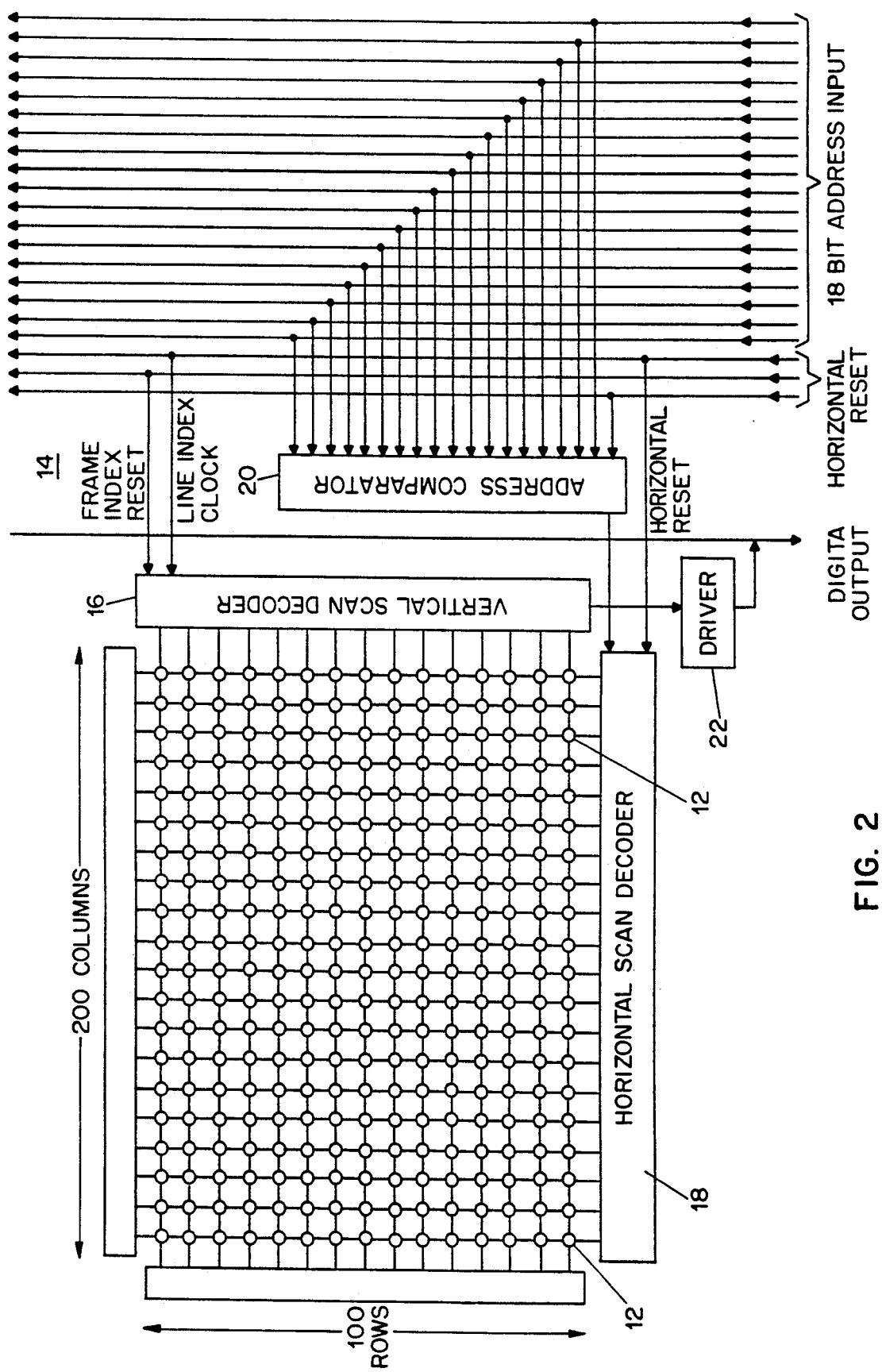
FIG. 2 is a greatly enlarged view of a segment of one of the tracks of the tape shown in FIG. 1 showing one frame of memory and associated input/output circuitry.
Figure 4:
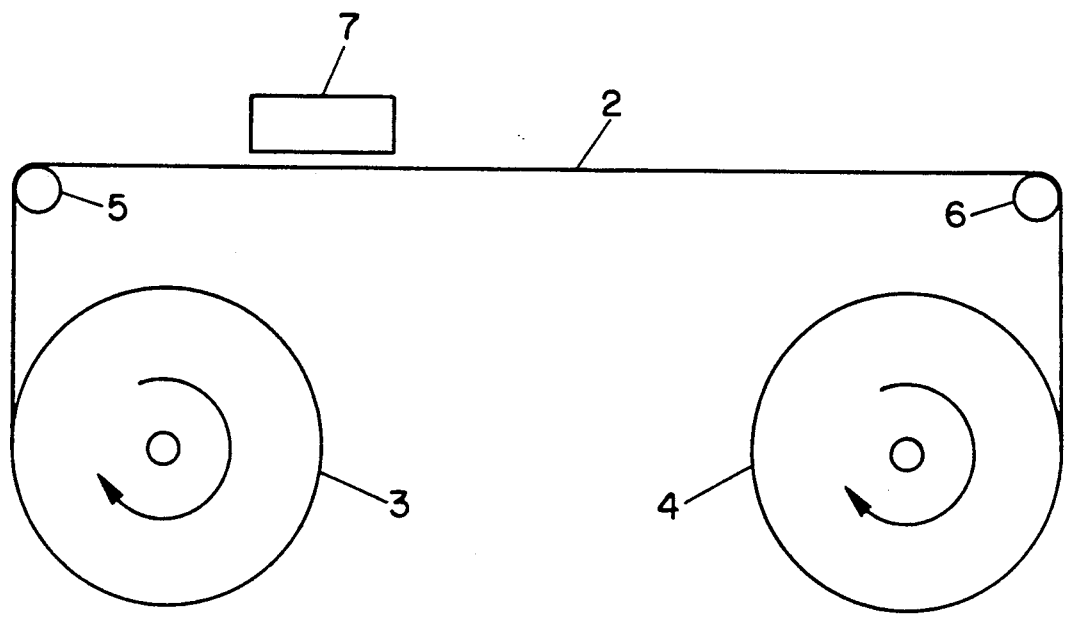
FIG. 4 is a schematic diagram of reel-to-reel processing apparatus for fabricating the memory cells and associated circuitry.

Referring now to FIG. 4, the large-area array of memory cells, an extremely small fraction of which are depicted in FIGS. 1 and 2, is formed on a flexible substrate by sequentially depositing a multiplicity of layers using lithographic techniques similar to the processes in current use for manufacturing active matrix LCD panels, except that all steps are performed on a reel-to-reel continuous process. That is to say, a web 2 of thin, flexible polyimide, which currently is in widespread use in thin film semiconductor technology, which typically is four inches wide, is transported back and forth between a first reel 3 and a second reel 4 and guided by guide posts 5 and 6 along a path along which the devices required to carry out the steps of the lithographic process are distributed. In general, the process includes the steps of laying down a layer, laying down a resist, drying, exposing, developing, etching, laying down another resist and so on. Since some of these steps are performed in air, some in a gas other than air, and some in a vacuum, the substrate is transported through the necessary chambers (not shown) which are conventional. The number of steps that can be performed during each pass of the substrate, which may be two hundred meters (650 ft.) long from one reel to the other depends on the lineal speed needed for each step and the environment.

For example, on a first pass the substrate may be coated with a thin metal electrode layer, which in turn, is coated with an electron-sensitive resist which after drying is patterned by a suitable exposing device, schematically indicated at 7 in FIG. 4, preferably a direct electron beam patterning device which is electrically controllable in accordance with the information that is to define the pattern of memory cells. This information, which may be stored in a computer, is addressed to the lithography apparatus so that exposure of the resist starts at a defined location on the continuously moving tape. The resist pattern is transferred by etching to the underlying metal surface. Since the exposing electron beam needs to scan only in one direction to lay down the pattern illustrated in FIG. 1, it can have a very small spot size, for example less than 0.5 μm. To produce the desired one hundred parallel tracks, one-hundred exposing devices each having this spot size are uniformly distributed across the width of the tape at one millimeter intervals. In order to register succeeding exposures with the pattern first laid down, synchronization marks are exposed at both ends of the scan, to be read out in succeeding passes by a respective beam of a "read as you write" exposing device; these registration marks are not covered by succeeding depositions. Assuming that the foregoing steps are all that can be performed in one pass, the next series of steps are performed either as the tape is being transported in the opposite direction to the starting reel, or after each pass the tape may be rewound and again transported to the take-up reel in the same direction as the first series of steps were performed.

Figure 5:
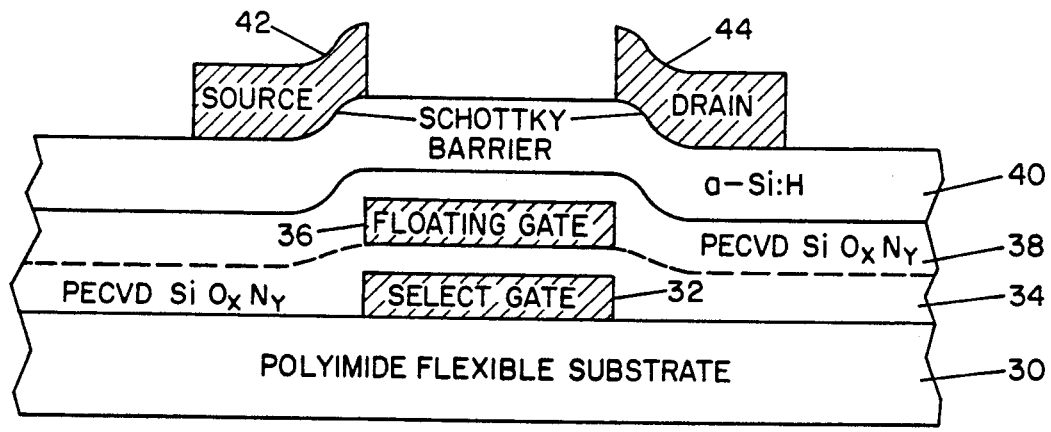
FIG. 5 is an enlarged cross-section of an EEPROM one-bit memory cell.

In a preferred embodiment of the memory device the memory cell 12 at each crossing of the active matrix depicted in FIG. 2 is a floating gate memory manufactured using the process briefly described above. As seen in the cross-section of a one-bit cell illustrated in FIG. 5, the several levels of the device are successively deposited on a flexible polyimide substrate 30: a polysilicon select gate 32; a first layer 34 of plasma silicon nitride deposited over gate 32 by plasma enhanced chemical vapor deposition (PECVD); a polysilicon floating gate 36 formed over select gate 32 and electrically isolated therefrom by layer 34, a second plasma silicon nitride layer 38 formed over layer 34 and the floating gate for completely isolating the floating gate, an amorphous a-Si:H layer 40; and polysilicon source and drain electrodes 42 and 44, respectively, deposited on layer 42 and positioned outwardly from respective opposite ends of floating gate 36.

Preparatory to the fabrication of the described matrix of cells, a composite drawing of the layouts of the different masking levels is converted to digital data, using known interactive graphic displays and digitizers, and this data is used to drive a computer-controlled pattern generator. The pattern for the first level includes a registration mark or pattern which is "read" by the pattern generator as it writes successive layer exposures. The stored information that defines the pattern is derived in real time from the computer memory and electronically modulates the exposing device. Clock signals for clocking pattern information out of memory are synchronized by the registration patterns, enabling rapid production of long continuous strips of memory at relatively low cost.

Figure 5A:
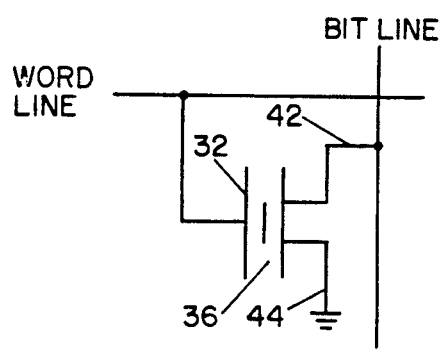
FIG. 5A and FIG. 5B are a schematic diagram and the transfer function, respectively, of the EEPROM device shown in FIG. 4.
Figure 5B:
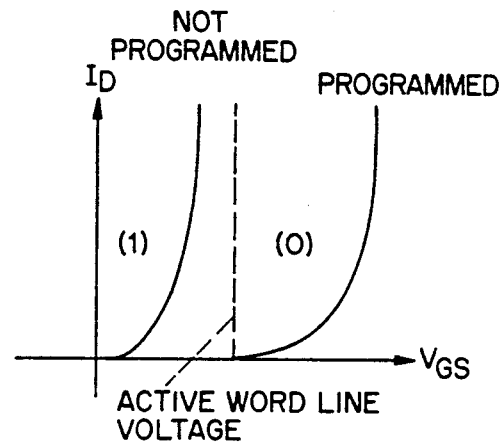

Referring to the schematic diagram of the one-bit memory shown in FIG. 5A, the gate 36 is floating, the select gate 32 is connected to a word or column line, the source 42 is connected to a column or bit line and the drain 44 is connected to ground. If there is charge on the floating gate, the typical $I_D$ Vs. $V_{GS}$ curve (1) shown in FIG. 5B is obtained. Since the threshold voltage $V_T$ is low, a HIGH on the word line will turn the cell ON, causing the column or bit line to go LOW, which is interpreted as a logic ONE. To program the cell to store a desired logic state, a voltage higher than $V_T$ is applied to the drain 44 and select gate 32; a conduction channel is established and the device operates in saturation. Electrons are accelerated in the high field region and acquire sufficient energy to enter the gate dielectric ($SiO_xN_y$) layer conduction band. The electrons are attracted by the positive potential on the select gate and many of them lodge on the floating gate. When the programming potential is removed, the electrons on the floating gate are trapped, resulting in a sheet of negative charge between the select gate 32 and the a-Si:H layer 40, which effectively increases the threshold voltage of the transistor, thereby rendering it cut off when addressed by normal read operation voltages; thus, the cell is now programmed to logic ZERO, as indicated in FIG. 5B. The inherently high resistivity of the a-Si:H layer of nearly $10^{10}$ ohm-cm minimizes leakage of charge from the floating gate and is a key feature for minimizing the need for, or rate of, refresh.

Figure 6A:
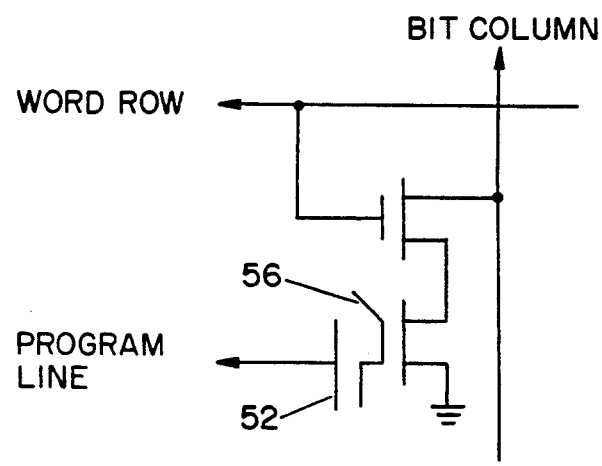
FIG. 6A is a schematic diagram of the one-bit memory cell shown in FIG. 5.
Figure 6:
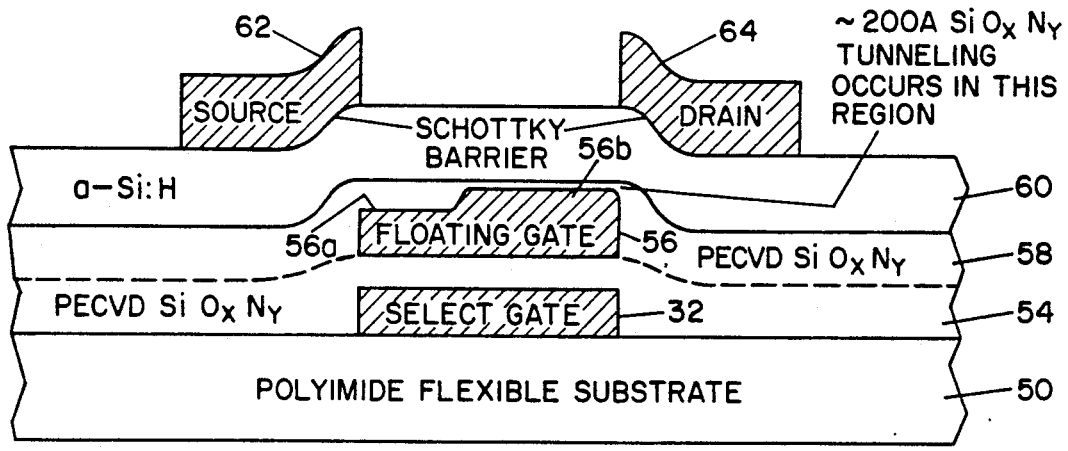
FIG. 6 is an enlarged cross-section of a floating-gate tunnel-oxide one-bit memory cell.

Alternatively, the memory cell at each crossing of the active matrix depicted in FIG. 2 may be a floating-gate tunnel-oxide one-bit memory patterned after a MOS EEPROM, shown in cross-section in FIG. 6 and schematically in FIG. 6A. Using a-Si:H TFT topology and the process steps generally outlined above for fabricating the EEPROM device of FIG. 5, the several levels of the device are deposited in successive processing steps on a flexible polyimide substrate 50. A polysilicon select gate 52 first formed on the substrate is covered by a first layer 54 of plasma silicon nitride which electrically isolates the select gate from a floating gate 56 formed above it. As viewed in FIG. 6, a left hand portion 56a of the floating gate is thinner than the right hand portion 56b such that the top surface is stepped. Unlike conventional crystalline silicon MOSFETs in which the gate dielectric is usually $SiO_2$, the layer 54 and a second layer 58 deposited over the floating gate preferably are formed from a silicon oxynitride ($SiO_xN_y$) dielectric. It is critical that the thickness of dielectric layer 58 formed over the thicker portion of the floating gate, the region where tunneling takes place, be less than 200 Angstroms in order that the floating gate can be charged or discharged by Fowler-Nordheim tunneling. A layer 60 of amorphous A-Si:H is formed over layer 58 and polysilicon source and drain electrodes 62 and 64, respectively, are deposited on layer 60 and disposed outwardly from the ends of the thin and thicker portions respectively, of the floating gate.

As shown in the FIG. 6A schematic of the one-bit memory cell of FIG. 6, the gate 56 is floating, the select gate 52 connects externally to a program line, and drain 64 connects externally to a bit column line. To program an initially erased cell, a logic ZERO is written in by connecting the bit column to a positive voltage while grounding the program line and biasing the word select line, and a logic ONE is written in by connecting the bit column to a negative voltage while grounding the program line and biasing the word select line. This will cause electrons from those gates where ZEROS are stored to tunnel back to the drains. For the READ operation, both row and program lines are HIGH, and if electrons are stored in the floating gate, the field will keep the cell OFF, and the bit line shown in FIG. 6A will remain HIGH.

The problem of the large number of "drop-outs" likely to occur in the described manufacturing process are solved in much the same way that digital tape recorders solve drop-out problems present in digital magnetic tape, namely, by using two-dimensional error-correcting codes. The use of two-dimensional or three-dimensional error correcting codes can result in flawless reconstruction of the original bit stream, provided the drop-outs are not correlated. In magnetic recording of digital video, the bits are "scrambled" to assure there is no correlation between drop-outs. In the present memory, the chance of correlation between drop-outs is essentially eliminated by organizing the ten bits (8-bit encoding with two bits of error-correcting code) so that each of the ten bits is on a different tape. Additionally, the bits may be "scrambled" as further assurance of decorrelation, should this be necessary.

While currently preferred embodiments of the memory device according to the invention and methods of manufacturing them have been disclosed, it is to be understood that many changes in details may be made as a matter of engineering choices without departing from the spirit and scope of the invention. For example, the a-Si:H layer 40 in FIG. 5 and the layer 60 in FIG. 6 may instead be microcrystalline silicon, and the polysilicon gate layers do not have to be strictly polysilicon, but can be other materials which are substantially polycrystalline or amorphous and contain a large fraction of silicon. Also, although the memory has been described as having a particular physical size and memory cell dimensions to achieve maximum memory capacity for a given volume, it will be understood that these parameters are by way of example only and should not be interpreted as limiting. Likewise, although the described memory system has ten tapes, each for accommodating one bit of a code consisting of ten bits, if shorter or longer word length codes are used, a number of tapes corresponding to the number of bits in the code would be used in the assembled device. Therefore, the invention is not deemed to be limited except as defined by the appended claims.

I claim:

1. Method for manufacturing large capacity, random access, solid-state memory apparatus which is digitally addressable by an n-bit code comprising the steps of:
    (a) fabricating on a thin, flexible elongate substrate in a continuous process a large-area memory element comprising a multiplicity of matrices of memory cells, address circuits for addressing the matrices and an output circuit for deriving output signals from said matrices to obtain a large-area memory device in the form of a tape;
    (b) repeating step (a) n times to obtain a plurality of said large-area memory devices equal in number to the number of bits in the n-bit code; and
    (c) winding said plurality of tapes one upon the other into a compact cylindrical spool.

2. Method according to claim 1, wherein in step (a) said large-area memory element is fabricated in a continuous lithographic process using thin film transistor technology.

3. A method for producing a large capacity, random access solid-state memory device which is digitally addressable by an n-bit code, said method comprising:
    (a) using a continuous process, forming on a thin, flexible elongate substrate a large-area memory element comprising a multiplicity of matrices of memory cells, address circuits for addressing the matrices and an output circuit for deriving output signals from said matrices to obtain an addressable large-area memory device in the form of an elongate tape;
    (b) repeating step (a) n times to obtain n memory devices each in the form of an elongate tape; and
    (c) winding the n elongate tapes one upon the other into a compact cylindrical spool.

4. A method of producing a large capacity solid-state memory apparatus having a plurality of large-area memory devices each comprising a multiplicity of active matrices of memory cells formed on a thin, flexible elongate substrate, address circuits for addressing the matrices and an output circuit for deriving output signals from said matrices, wherein said plurality of elongate substrates are wound one upon the other into a compact spool, said method comprising the steps of:
    (a) forming on a thin, flexible elongate indulating substrate in a continuous process a multiplicity of active matrices of amorphous silicon thin film transistors, address circuits for addressing the matrices and an output circuit for deriving output signals from the matrices;
    (b) repeating step (a) the number of times needed to form said plurality of large-area memory devices; and
    (c) winding the plurality of large-area memory devices one upon the other into a compact cylindrical spool.

* * * * *